(12) United States Patent
Yasuda

(10) Patent No.: US 10,056,879 B2
(45) Date of Patent: Aug. 21, 2018

(54) ELASTIC WAVE FILTER DEVICE

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 20 days.

(21) Appl. No.: 15/485,375

(22) Filed: Apr. 12, 2017

(65) Prior Publication Data

US 2017/0310301 A1 Oct. 26, 2017

(30) Foreign Application Priority Data

Apr. 21, 2016 (JP) ................................ 2016-085076
Feb. 20, 2017 (JP) ................................ 2017-028828

(51) Int. Cl.

| H03H 9/64 | (2006.01) |
| H03H 9/54 | (2006.01) |
| H01L 41/047 | (2006.01) |
| H03H 9/00 | (2006.01) |
| H03H 9/66 | (2006.01) |
| H03H 9/70 | (2006.01) |
| H01L 41/08 | (2006.01) |

(52) U.S. Cl.
CPC ........... *H03H 9/542* (2013.01); *H01L 41/047* (2013.01); *H03H 9/0004* (2013.01); *H03H 9/66* (2013.01); *H03H 9/70* (2013.01)

(58) Field of Classification Search
CPC .................................. H03H 9/64; H01L 41/08

USPC ................................ 333/133, 195; 310/313 R
See application file for complete search history.

(56) References Cited

U.S. PATENT DOCUMENTS

| 5,392,013 A * | 2/1995 | Yamamoto ........... H03H 9/6436 310/313 B |
| 5,965,969 A * | 10/1999 | Kadota .................... H03H 9/25 310/313 R |
| 6,937,116 B2 * | 8/2005 | Takagi ............... H03H 9/14517 310/313 B |
| 8,264,122 B2 * | 9/2012 | Mimura ............... H03H 9/0222 310/313 A |
| 8,427,032 B2 * | 4/2013 | Nishiyama ......... H03H 9/02669 310/313 A |

(Continued)

FOREIGN PATENT DOCUMENTS

| JP | 2010193135 A * | 9/2010 |
| JP | 2015-111845 A | 6/2015 |

*Primary Examiner* — Dean Takaoka
(74) *Attorney, Agent, or Firm* — Keating & Bennett, LLP

(57) ABSTRACT

In an elastic wave filter device, a first filter including a first pass band and a second filter including a second pass band are common-connected at a common connection point. The first filter includes, on the common connection point side, a serial arm resonator, a parallel arm resonator, or a longitudinally coupled resonator-type elastic wave filter, and generates a fundamental wave and a high-order mode. A resonant frequency of the high-order mode on a higher frequency side relative to the first pass band of the first filter is smaller than the second pass band. On the common connection point side, a serial arm resonator in which the resonant frequency is not the highest, a parallel arm resonator, or a longitudinally coupled resonator-type elastic wave filter, is disposed.

22 Claims, 8 Drawing Sheets

(56) References Cited

U.S. PATENT DOCUMENTS 9,935,611 B2 * 4/2018 Otagawa .............. H03H 9/6489
2013/0300519 A1 11/2013 Tamasaki et al.

* cited by examiner

ELASTIC WAVE FILTER DEVICE

CROSS REFERENCE TO RELATED APPLICATIONS

This application claims the benefit of priority to Japanese Patent Application No. 2016-085076 filed on Apr. 21, 2016 and Japanese Patent Application No. 2017-028828 filed on Feb. 20, 2017. The entire contents of each of these applications are hereby incorporated herein by reference.

BACKGROUND OF THE INVENTION

1. Field of the Invention

The present invention relates to an elastic wave filter device in which one end of a first filter and one end of a second filter are common-connected.

2. Description of the Related Art

Japanese Unexamined Patent Application Publication No. 2015-111845 discloses an elastic wave filter device that is connected to an antenna of a cellular phone. The elastic wave filter device includes a transmission filter configured of an elastic wave filter and a reception filter configured of an elastic wave filter. One end of the transmission filter and one end of the reception filter are common-connected. The common-connected portion is connected to the antenna.

The transmission filter of the elastic wave filter device described in Japanese Unexamined Patent Application Publication No. 2015-111845 makes use of Rayleigh waves propagating in $LiNbO_3$. In the transmission filter, an element closest to a common connection point is a serial arm resonator. A pass band of the reception filter is set to be higher than a pass band of the transmission filter.

In the case where one end of each of a plurality of band pass filters is common-connected to each other, as described in Japanese Unexamined Patent Application Publication No. 2015-111845, there arises a problem that a mode generated in one band pass filter affects filter characteristics of another band pass filter.

In Japanese Unexamined Patent Application Publication NO. 2015-111845, the transmission filter makes use of a fundamental wave of Rayleigh waves propagating in $LiNbO_3$. In this case, in addition to the fundamental wave, a high-order mode such as a mode including Sezawa waves, for example, is also excited. In the case where the high-order mode is positioned in the pass band of the reception filter, there arises a problem that insertion loss in the pass band of the reception filter becomes large.

SUMMARY OF THE INVENTION

Preferred embodiments of the present invention provide elastic wave filter devices capable of reducing insertion loss in a pass band of a second filter in a case where a first filter in which not only a fundamental wave but also a high-order mode is excited is common-connected with the second filter.

An elastic wave filter device according to a preferred embodiment of the present invention includes a first filter including a first pass band f1, and a second filter including a second pass band f2 that is positioned on a higher frequency side relative to the first pass band f1. In the elastic wave filter device, one end of the first filter and one end of the second filter are common-connected at a common connection point; the first filter includes, on the common connection point side, a serial arm resonator including an IDT (interdigital transducer) electrode, a parallel arm resonator, or a longitudinally coupled resonator-type elastic wave filter; the first filter is a filter that generates a fundamental wave and a high-order mode; and in the case where a resonant frequency of the high-order mode that appears on a higher frequency side relative to the first pass band f1 of the first filter is f1$h$, f1$h$ is smaller than f2, and on the common connection point side, (1) a serial arm resonator in which the resonant frequency is not the highest, (2) a parallel arm resonator, or (3) a longitudinally coupled resonator-type elastic wave filter, is provided.

In an elastic wave filter device according to a preferred embodiment of the present invention, the serial arm resonator in which the resonant frequency is not the highest is a serial arm resonator in which the resonant frequency is the lowest.

In an elastic wave filter device according to a preferred embodiment of the present invention, as the serial arm resonator in which the resonant frequency is not the highest, a serial arm resonator in which an electrode finger pitch of the IDT electrode is not the smallest is disposed on the common connection point side in the first filter. In this case, the serial arm resonator in which the resonant frequency is not the highest is able to be formed with ease just by adjusting the electrode finger pitch when forming the IDT electrode.

In an elastic wave filter device according to a preferred embodiment of the present invention, the serial arm resonator in which the electrode finger pitch of the IDT electrode is not the smallest is a serial arm resonator in which the electrode finger pitch of the IDT electrode is the largest.

In an elastic wave filter device according to a preferred embodiment of the present invention, the first filter is an elastic wave filter making use of Rayleigh waves that propagate in $LiNbO_3$.

In an elastic wave filter device according to a preferred embodiment of the present invention, a phase adjustment circuit is further provided.

An elastic wave filter device according to another preferred embodiment of the present invention includes a first filter including a first pass band f1, and a second filter including a second pass band f2 that is positioned on a higher frequency side relative to the first pass band f1. In the elastic wave filter device, one end of the first filter and one end of the second filter are common-connected at a common connection point; the first filter includes, on the common connection point side, a serial arm resonator, a parallel arm resonator including an IDT electrode, or a longitudinally coupled resonator-type elastic wave filter; the first filter is a filter that generates a fundamental wave and a high-order mode; and in the case where a resonant frequency of the high-order mode that appears on a higher frequency side relative to the first pass band f1 of the first filter is f1$h$, f1$h$ is larger than f2, and on the common connection point side, (4) a parallel arm resonator in which the resonant frequency is not the lowest, (5) a serial arm resonator, or (6) a longitudinally coupled resonator-type elastic wave filter, is provided.

In an elastic wave filter device according to a preferred embodiment of the present invention, the parallel arm resonator in which the resonant frequency is not the lowest is a parallel arm resonator in which the resonant frequency is the highest.

In an elastic wave filter device according to a preferred embodiment of the present invention, as the parallel arm resonator in which the resonant frequency is not the lowest, a parallel arm resonator in which an electrode finger pitch of the IDT electrode is not the largest is disposed on the common connection point side in the first filter. In this case, the parallel arm resonator in which the resonant frequency is the highest is able to be formed with ease only by adjusting the electrode finger pitch when forming the IDT electrode.

In an elastic wave filter device according to a preferred embodiment of the present invention, the parallel arm resonator in which the electrode finger pitch of the IDT electrode is not the largest is a parallel arm resonator in which the electrode finger pitch of the IDT electrode is the smallest.

In an elastic wave filter device according to a preferred embodiment of the present invention, the first filter is an elastic wave filter making use of Rayleigh waves that propagate in $LiNbO_3$.

In an elastic wave filter device according to a preferred embodiment of the present invention, a phase adjustment circuit is further provided.

In an elastic wave filter device according to a preferred embodiment of the present invention, the first filter may be a ladder filter including a plurality of serial arm resonators including elastic wave resonators and a plurality of parallel arm resonators including elastic wave resonators.

In an elastic wave filter device according to a preferred embodiment of the present invention, the first filter may be a filter including a longitudinally coupled resonator-type elastic wave filter. In this case, the first filter may include at least one of a serial arm resonator and a parallel arm resonator being disposed on the common connection point side of the longitudinally coupled resonator-type elastic wave filter or on the opposite side thereof to the common connection point.

In an elastic wave filter device according to a preferred embodiment of the present invention, at least one of the first filter and the second filter is connected to the common connection point via a switch that switches a connecting state with the common connection point.

In an elastic wave filter device according to a preferred embodiment of the present invention, each of the first filter and the second filter is connected to the common connection point via the switching section.

With the elastic wave filter devices according to preferred embodiments of the present invention, insertion loss in the pass band of the second filter is reduced.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, the present invention will be clarified through description of specific preferred embodiments of the present invention with reference to the drawings.

It is to be noted that the respective preferred embodiments described in this specification are merely examples and the configurations thereof can be partly replaced or combined between different preferred embodiments.

Figure 1:
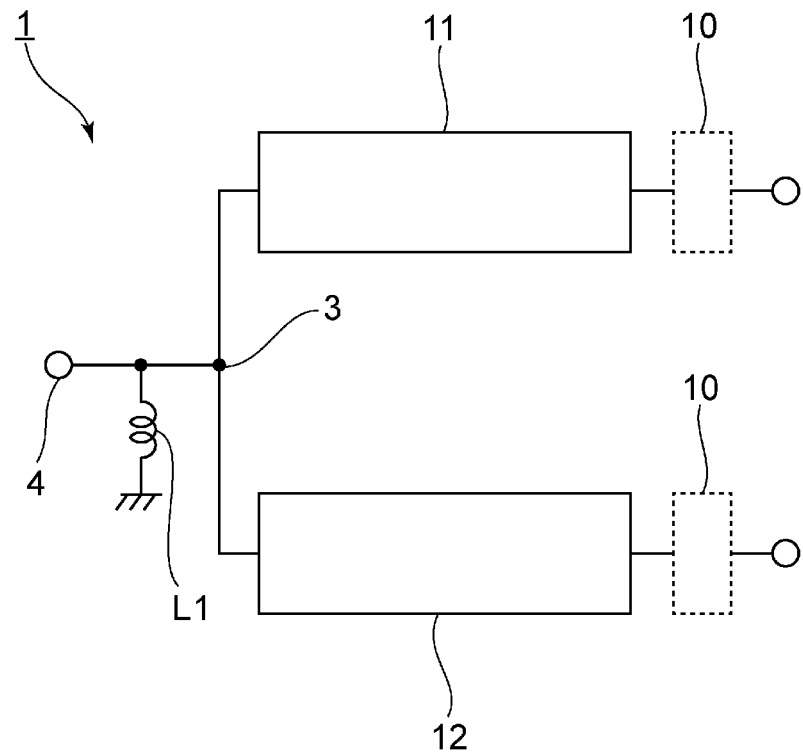
FIG. 1 is a block diagram of an elastic wave filter device according to a first preferred embodiment of the present invention.

FIG. 1 is a block diagram of an elastic wave filter device according to a first preferred embodiment of the present invention. An elastic wave filter device 1 includes a first filter 11 and a second filter 12. The first filter 11 includes an elastic wave filter that makes use of Rayleigh waves propagating in $LiNbO_3$. The first filter 11 is a band pass filter including a first pass band f1.

Although the second filter 12 is not limited to any specific type of filter, the second filter 12 in this preferred embodiment includes an elastic wave filter. The second filter 12 is a band pass filter including a second pass band f2. The second pass band f2 is positioned on a higher frequency side relative to the first pass band f1.

One end of the first filter 11 and one end of the second filter 12 are common-connected at a common connection point 3. The common connection point 3 is connected to an antenna terminal 4. The antenna terminal 4 is preferably connected to an antenna of a cellular phone or the like. The elastic wave filter device 1 is used in a cellular phone or the like. Although the first filter 11 and the second filter 12 are illustrated in FIG. 1, one or more band pass filters may additionally be connected to the common connection point 3.

An inductor L1 that performs impedance matching is connected between the common connection point 3 and a ground potential.

Figure 2:
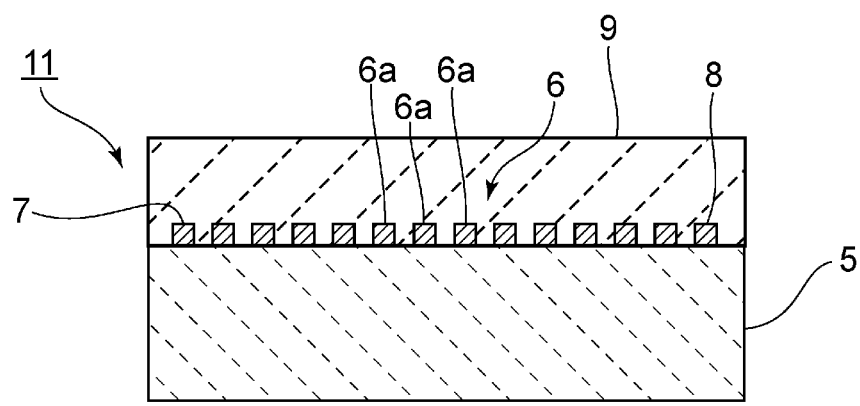
FIG. 2 is a schematic cross-sectional front view for explaining the elastic wave filter device of the first preferred embodiment of the present invention.

FIG. 2 is a cross-sectional front view schematically illustrating a physical structure of the first filter 11. The first filter 11 includes a $LiNbO_3$ substrate 5. An IDT electrode 6 is provided on the LiNbO$_3$ substrate 5. The IDT electrode 6 includes a plurality of electrode fingers 6a. Reflectors 7 and 8 are respectively provided at both sides of the IDT electrode 6 in an elastic wave propagation direction, thus defining one elastic wave resonator. A dielectric layer 9 is laminated to cover the IDT electrode 6 and the reflectors 7, 8. The dielectric layer 9 is formed with SiO$_2$ or the like.

Figure 3:
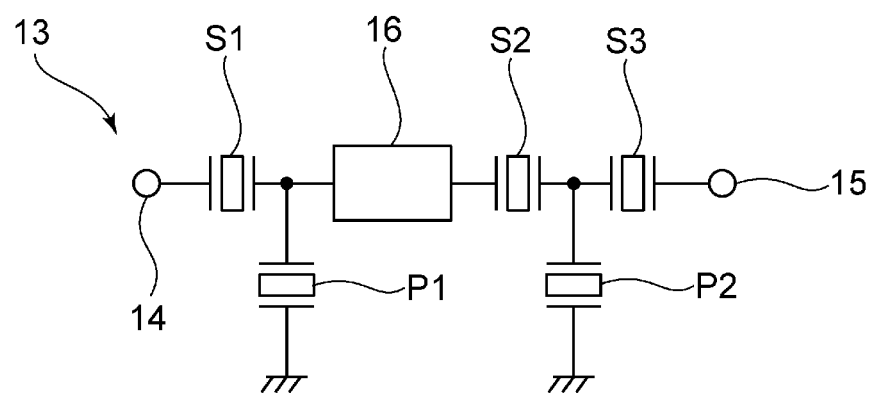
FIG. 3 is a circuit diagram of a first filter used in working example 1.
Figure 4:
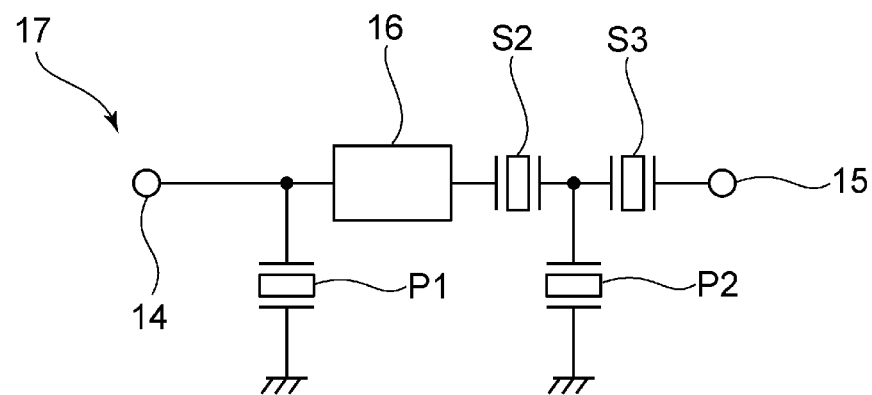
FIG. 4 is a circuit diagram of a first filter used in working example 2.
Figure 5:
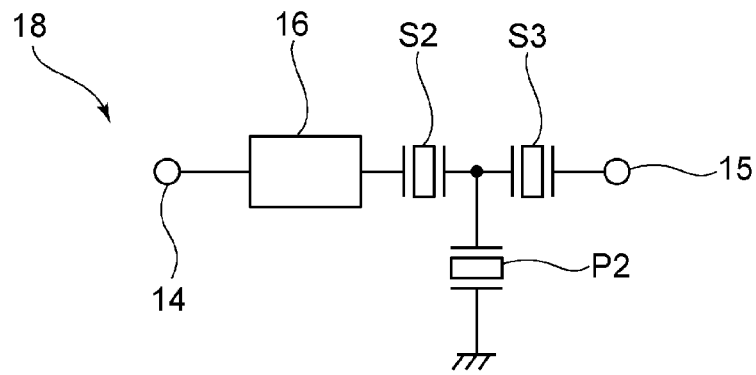
FIG. 5 is a circuit diagram of a first filter used in working example 3.

The first filter 11 includes a plurality of elastic wave resonators and a longitudinally coupled resonator-type elastic wave filter. Working examples 1 to 3 regarding the first filter 11 are shown in FIGS. 3 to 5, respectively. A first filter 13 of working example 1 includes a first terminal 14 and a second terminal 15, as shown in FIG. 3. The first terminal 14 is a terminal to be connected to the common connection point 3.

A longitudinally coupled resonator-type elastic wave filter 16 is disposed in a serial arm connecting the first terminal 14 and the second terminal 15. In the first filter 13, a pass band is defined by the longitudinally coupled resonator-type elastic wave filter 16. Further, a serial arm resonator S1 and a parallel arm resonator P1 are provided on the common connection point side of the longitudinally coupled resonator-type elastic wave filter 16. Furthermore, serial arm resonators S2, S3 and a parallel arm resonator P2 are provided between the longitudinally coupled resonator-type elastic wave filter 16 and the second terminal 15. The serial arm resonator S1 and the parallel arm resonator P1 as well as the serial arm resonators S2, S3 and the parallel arm resonator P2 are provided to adjust the pass band.

The first filter 13 makes use of Rayleigh waves propagating in LiNbO$_3$. In this case, in addition to Rayleigh waves, a high-order mode such as a mode including Sezawa waves is also excited. The first filter 13 preferably is a reception filter of Band 25, for example.

The second filter 12 preferably is a reception filter of Band 41.

The first pass band f1 of the reception filter of Band 25 preferably falls within a range of about 1930 MHz to 1995 MHz, for example. The second pass band f2 of the reception filter of Band 41 preferably falls within a range of about 2496 MHz to 2690 MHz, for example. Accordingly, f2 is greater than f1. Further, in the first filter 13, a resonant frequency of Sezawa waves generated as a high-order mode is f1$h$.

In the elastic wave filter device 1 of the first preferred embodiment, f1$h$ is set to be smaller than f2.

The serial arm resonator S1 is disposed on a bundled end side, that is, the common connection point 3 side in the first filter 13. Of the serial arm resonators S1 to S3 defining a serial trap, the serial arm resonator S1 is a serial arm resonator in which the resonant frequency is not the highest.

Note that only a single serial arm resonator S1 may be disposed in the first filter of the first preferred embodiment. In this case, the single arm resonator S1 becomes a serial arm resonator in which the resonant frequency is not the highest. That is, in the description of preferred embodiments of the present invention, the expression "a serial arm resonator in which the resonant frequency is not the highest" is not limited to a configuration including a plurality of serial arm resonators.

The expression "to be disposed on the common connection point side" means "to be provided at a position closest to the common connection point" in the circuit configuration of the first filter.

In FIG. 3, an element that is disposed on the common connection point side in the first filter 13 has a large influence on the filter characteristics of the second filter 12.

In the first filter 13, the element that is disposed on the common connection point side is the serial arm resonator S1. In general, a resonant frequency of a high-order mode such as Sezawa waves satisfies a relation of, when Sezawa waves are taken as an example, a resonant frequency of Sezawa waves in a parallel arm resonator<a resonant frequency of Sezawa waves in a longitudinally coupled resonator-type elastic wave filter<a resonant frequency of Sezawa waves in a serial arm resonator.

In the first filter 13, of the serial arm resonators S1 to S3, the serial arm resonator S1 on the common connection point side is a resonator in which the resonant frequency is not the highest. As such, although f1$h$<f2, the resonant frequency f1$h$ of the high-order mode in the serial arm resonator S1 including the largest influence on the filter characteristics is distanced toward a lower frequency side relative to the second pass band f2 of the second filter 12. This makes it possible to reduce in-band insertion loss in the second pass band f2 of the second filter 12.

It is preferable that, of the serial arm resonators S1 to S3, the serial arm resonator S1 be a serial arm resonator in which the resonant frequency is the lowest. In this case, the insertion loss in the pass band is able to be further reduced.

FIG. 4 is a circuit diagram of a first filter 17 of working example 2 that is used in the elastic wave filter device of the first preferred embodiment. The first filter 17 of working example 2 corresponds to the structure shown in FIG. 3 from which the serial arm resonator S1 is removed. Other elements of the first filter 17 are the same as those of the first filter 13.

As such, a parallel arm resonator P1 is disposed on the common connection point side in the first filter 17 of working example 2.

As discussed above, a resonant frequency of a high-order mode satisfies a relation of, as long as the order of the high-order mode is the same, a resonant frequency of the high-order mode in a parallel arm resonator<a resonant frequency of the high-order mode in a longitudinally coupled resonator-type elastic wave filter<a resonant frequency of the high-order mode in a serial arm resonator. Accordingly, in the first filter 17 of working example 2, because the resonant frequency of the high-order mode in the parallel arm resonator P1 disposed on the common connection point side is low, the resonant frequency f1$h$ of the high-order mode in the parallel arm resonator P1 including the largest influence on the filter characteristics is effectively distanced toward a lower frequency side relative to the second pass band f2 of the second filter. This makes it possible to reduce the insertion loss in the pass band of the second filter 12, also with the first filter 17 of working example 2.

FIG. 5 is a circuit diagram of a first filter of working example 3 that is used in the elastic wave filter device of the first preferred embodiment.

A first filter 18 of working example 3 corresponds to a structure of the first filter 13 of working example 1 from which the serial arm resonator S1 and the parallel arm resonator P1 are removed. Other elements are the same as those of working example 1.

In the first filter 18 of working example 3, a longitudinally coupled resonator-type elastic wave filter 16 is disposed on the common connection point side. As discussed above, as long as the order of the high-order mode is the same, the following relation is satisfied: a resonant frequency of the high-order mode in a parallel arm resonator<a resonant frequency of the high-order mode in a longitudinally coupled resonator-type elastic wave filter<a resonant frequency of the high-order mode in a serial arm resonator. Accordingly, also in the case of using the first filter 18 of working example 3, because the resonant frequency of the high-order mode in the longitudinally coupled resonator-type elastic wave filter 16 is low, the resonant frequency f1$h$ of the high-order mode is able to be distanced toward a lower frequency side relative to the second pass band f2 of the second filter. This makes it possible to reduce the insertion loss in the pass band of the second filter 12.

Figure 6:
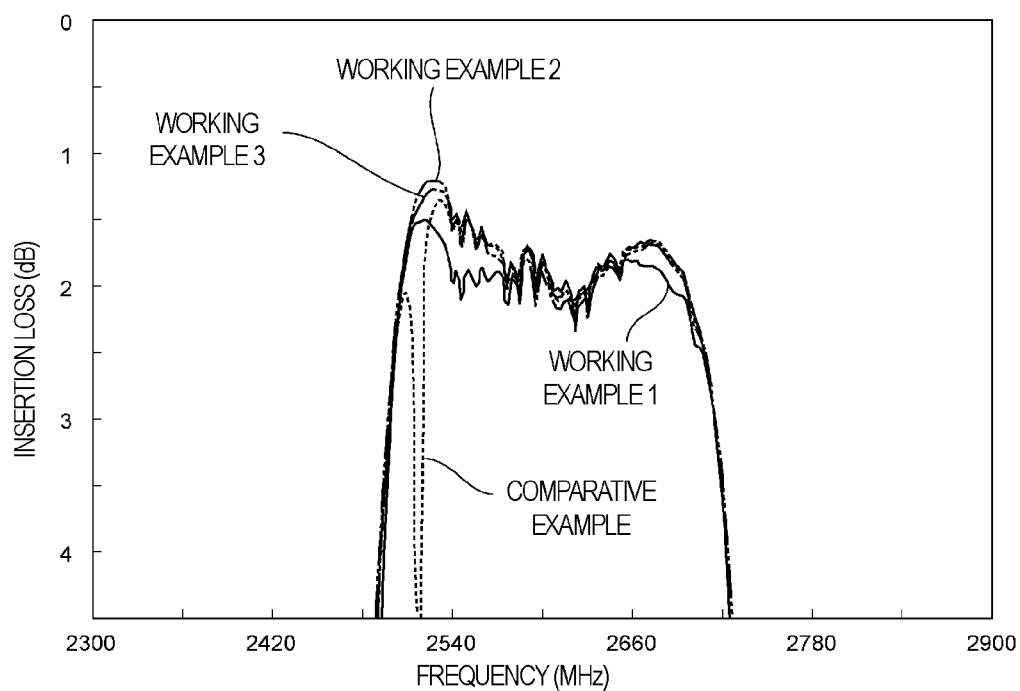
FIG. 6 is a diagram illustrating filter characteristics of second filters of elastic wave filter devices of working examples 1 to 3 and a comparative example.

FIG. 6 is a diagram illustrating filter characteristics of second filters, where a solid line indicates a case of using the first filter of working example 1, a broken line indicates a case of using a first filter of a comparative example, a double-dot dash line indicates a case of using the first filter of working example 2, and a dot-dash line indicates a case of using the first filter of working example 3.

As the first filter of the comparative example, a filter including the same circuit configuration as the first filter 13 of working example 1 shown in FIG. 3 is preferably used; note that, of the resonant frequencies of the serial arm resonators S1 to S3, the resonant frequency of the serial arm resonator S1 is set to be the highest. In this case, the resonant frequency of the high-order mode excited in the serial arm resonator S1 also becomes high. This makes f1$h$ approach f2. As is apparent from FIG. 6, it is understood that, in the filter characteristics of the comparative example indicated by the broken line, insertion loss is significantly worsened in the pass band of the second filter 12. In contrast, in the cases of using the first filters of working examples 1 to 3, it can be understood that the insertion loss is unlikely to be worsened in the pass band of the second filter, thus making it possible to reduce the insertion loss.

Figure 7:
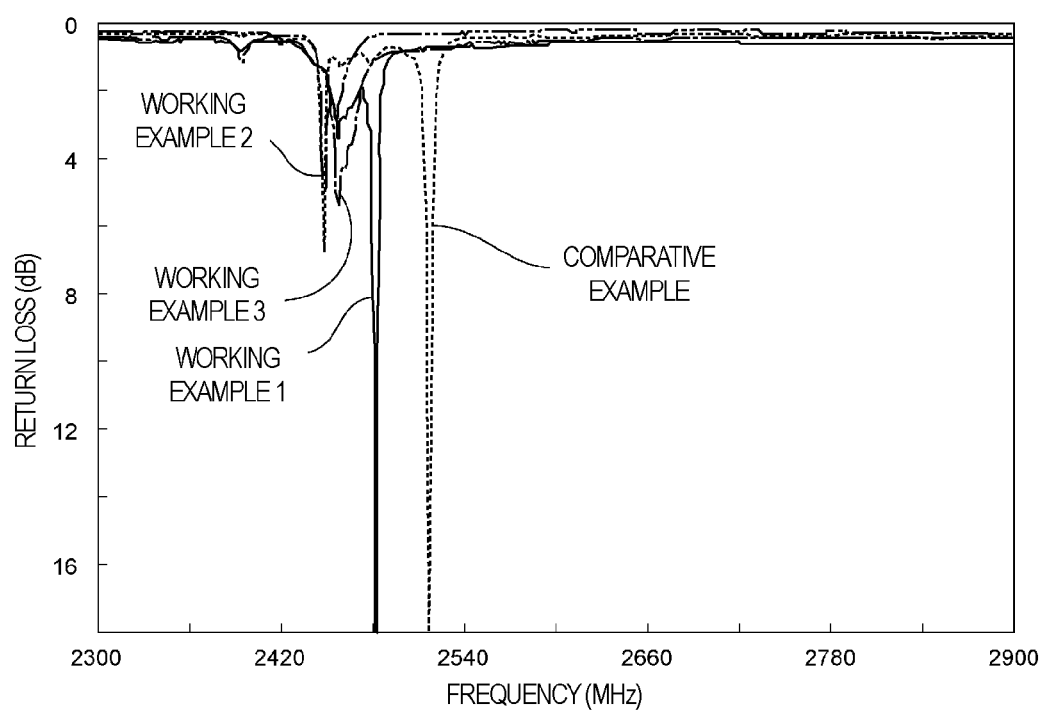
FIG. 7 is a diagram illustrating return loss characteristics when viewed from a common connection point side of each of first filter units in the elastic wave filter devices of working examples 1 to 3 and the comparative example.

FIG. 7 is a diagram illustrating return loss characteristics when viewed from the common connection point side of each of the first filter units of working examples 1 to 3 and the comparative example. As is apparent from FIG. 7, in each of working example 1 and the comparative example, a peak where the return loss is large due to the existence of the serial arm resonator S1 appears. In this case, in the comparative example indicated by the broken line, the peak is positioned on a higher frequency side.

As such, it is understood that the insertion loss is worsened in the pass band of the second filter as discussed above. Meanwhile, in working example 1, a portion where the return loss is worsened is distanced toward a lower frequency side relative to about 2496 MHz, which is a lower limit of the second pass band f2 of the second filter 12. Further, in the case of working example 2, a portion where the return loss is worsened due to the parallel arm resonator P1 appears near about 2447 MHz; in the case of working example 3, a portion where the return loss is worsened due to the longitudinally coupled resonator-type elastic wave filter 16 appears near about 2456 MHz. However, both of them are sufficiently distanced toward a lower frequency side relative to about 2496 MHz, which is a lower limit of the second pass band f2.

As discussed above, in the case of f1<f2, and f1$h$<f2, the insertion loss in the pass band of the second filter 12 is able to be reduced if the element disposed on the common connection point side of the first filter 11 is, (1) a serial arm resonator in which the resonant frequency is not the highest, (2) a parallel arm resonator, or (3) a longitudinally coupled resonator-type elastic wave filter 16.

A phase adjustment circuit 10 may be provided as indicated by a broken line in FIG. 1. As the phase adjustment circuit 10, an LC matching filter, a microstrip line, or the like can be used.

Next, an elastic wave filter device according to a second preferred embodiment of the present invention will be described. The elastic wave filter device of the second preferred embodiment has the same circuit configuration as the elastic wave filter device 1 of the first preferred embodiment shown in FIG. 1. As such, the first filter 11 and the second filter 12 are common-connected on the common connection point 3 side. Further, also in the elastic wave filter device of the second preferred embodiment, the first filter 11 is a reception filter of Band 25, and the first pass band f1 falls within the range of about 1930 MHz to 1995 MHz, for example. Further, like in the first preferred embodiment, the second filter 12 is a reception filter of Band 41, and the second pass band f2 falls within the range of about 2496 MHz to 2690 MHz, for example. Accordingly, f1 is smaller than f2.

Note that the configuration of the second preferred embodiment is such that the resonant frequency f1$h$ of the high-order mode in the first filter 11 is positioned to be larger than f2. In other words, the high-order mode in the first filter 11 is positioned on a higher frequency band side relative to the pass band of the second filter 12.

In the second preferred embodiment, as a result of the resonant frequency of the high-order mode in the first filter 11 being distanced toward a higher frequency band side relative to the pass band of the second filter 12, insertion loss in the pass band of the second filter 12 is able to be reduced. In order that the resonant frequency f1$h$ of the above high-order mode is distanced with certainty from the second pass band f2, in the second preferred embodiment, the element disposed on the common connection point 3 side of the first filter 11 is, (4) a parallel arm resonator in which the resonant frequency is not the lowest, (5) a serial arm resonator, or (6) a longitudinally coupled resonator-type elastic wave filter.

A plurality of working examples of the second preferred embodiment are shown in FIGS. 8 to 11.

Figure 8:
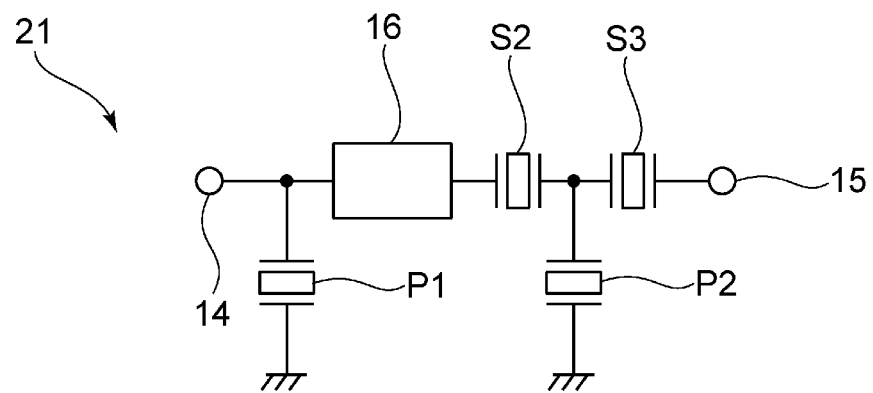
FIG. 8 is a circuit diagram of a first filter of working example 4 used in an elastic wave filter device according to a second preferred embodiment of the present invention.

FIG. 8 is a circuit diagram of a first filter of working example 4 of the second preferred embodiment. A first filter 21 includes a first terminal 14 and a second terminal 15. A longitudinally coupled resonator-type elastic wave filter 16 is disposed in a serial arm connecting the first terminal 14 and the second terminal 15. A pass band is provided by the longitudinally coupled resonator-type elastic wave filter 16. Further, a parallel arm resonator P1, serial arm resonators S2, S3, and a parallel arm resonator P2 are provided to adjust the pass band. Of these resonators, the parallel arm resonator P1 is disposed on the common connection point side of the longitudinally coupled resonator-type elastic wave filter 16. The serial arm resonators S2, S3 and the parallel arm resonator P2 are disposed between the longitudinally coupled resonator-type elastic wave filter 16 and the second terminal 15.

In the first filter 21, of the parallel arm resonators P1 and P2, the parallel arm resonator P1 disposed on the common connection point side is a parallel arm resonator in which the resonant frequency is not the lowest. As such, the resonant frequency of the high-order mode excited in the parallel arm resonator P1 is set to be relatively high. Accordingly, the resonant frequency of the high-order mode in the parallel arm resonator P1, which is an element on the common connection point side, is distanced toward a higher frequency side relative to an upper limit of the second pass band f2 of the second filter. This makes it possible to reduce the insertion loss in the pass band of the second filter 12.

It is preferable in the second preferred embodiment that the parallel arm resonator P1 is a parallel arm resonator in which the resonant frequency is the highest. In this case, the resonant frequency f1$h$ is able to be distanced toward a higher frequency side relative to the upper limit of the second pass band f2.

Although the parallel arm resonators P1 and P2 are provided in the first filter of working example 4 as shown in FIG. 8, only a single parallel arm resonator P1 may be provided. In other words, in various preferred embodiments of the present invention, the parallel arm resonator in which the resonant frequency is not the lowest is not limited to a configuration including a plurality of parallel arm resonators.

Figure 9:
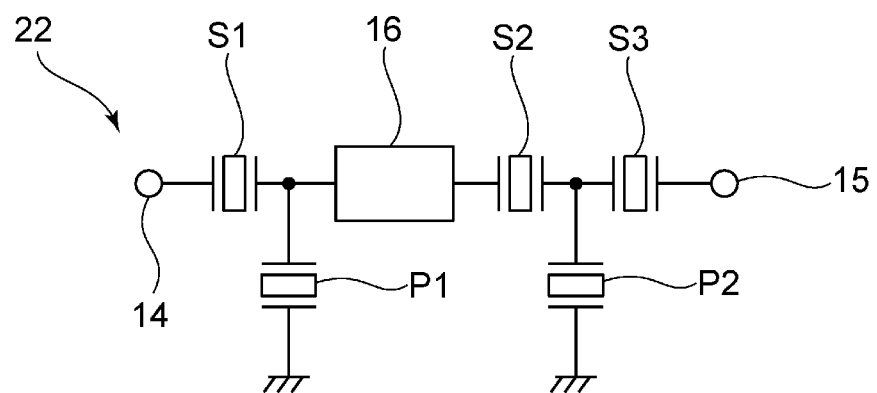
FIG. 9 is a circuit diagram of a first filter of working example 5 used in the elastic wave filter device according to the second preferred embodiment of the present invention.

FIG. 9 is a circuit diagram of a first filter 22 of working example 5 in the second preferred embodiment. In the first filter 22, a serial arm resonator S1 is provided on the common connection point side. Other elements are the same as those of the first filter 21 of working example 4. In this working example, the serial arm resonator S1 is disposed on the common connection point side. As discussed before, a resonant frequency of a high-order mode satisfies a relation of a resonant frequency of the high-order mode in a parallel arm resonator<a resonant frequency of the high-order mode in a longitudinally coupled resonator-type elastic wave filter<a resonant frequency of the high-order mode in a serial arm resonator. In the first filter 22, because the serial arm resonator S1 in which the resonant frequency of the high-order mode is high is connected on the common connection point side, the resonant frequency f1$h$ of the high-order mode is able to be positioned on a higher frequency side relative to the second pass band f2 with certainty. This makes it possible to reduce the insertion loss in the pass band of the second filter 12 as well.

Figure 10:
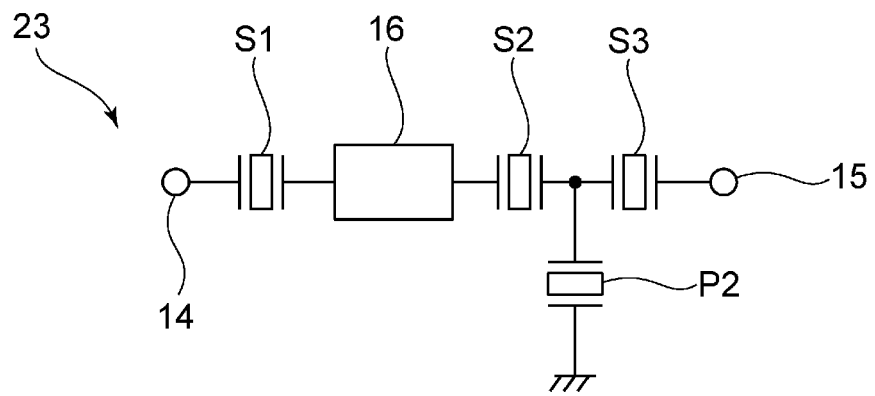
FIG. 10 is a circuit diagram of a first filter of working example 6 used in the elastic wave filter device according to the second preferred embodiment of the present invention.

FIG. 10 is a circuit diagram of a first filter of working example 6 of the second preferred embodiment. A first filter 23 corresponds to the structure of the first filter 22 from which the parallel arm resonator P1 is removed. Also in this case, because the serial arm resonator S1 is disposed on the common connection point side, the insertion loss in the pass band of the second filter 12 is able to be reduced in the same manner.

Figure 11:
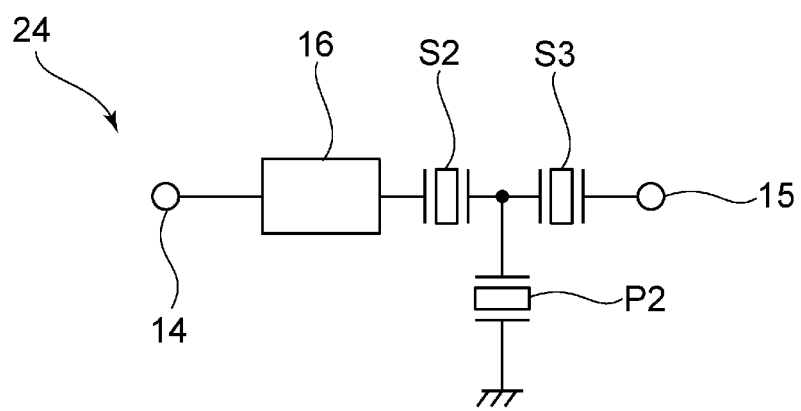
FIG. 11 is a circuit diagram of a first filter of working example 7 used in the elastic wave filter device according to the second preferred embodiment of the present invention.

FIG. 11 is a circuit diagram of a first filter 24 of working example 7 in the second preferred embodiment. The first filter 24 has a circuit configuration equivalent to that of the first filter 23 from which the serial arm resonator S1 is removed. As such, a longitudinally coupled resonator-type elastic wave filter 16 is disposed on the common connection point side. Accordingly, also in this case, because the resonant frequency f1$h$ of the high-order mode in the longitudinally coupled resonator-type elastic wave filter 16 is relatively high, the resonant frequency f1$h$ is distanced toward a higher frequency side relative to the second pass band f2. This makes it possible to reduce the insertion loss in the pass band of the second filter 12.

In the first and second preferred embodiments, resonant frequencies of the serial arm resonators, parallel arm resonators, and the like disposed on the common connection point side are selected. However, the adjustment of the resonant frequencies is easily made by adequately setting the design parameters of the elastic wave resonators defining the serial arm resonators and the parallel arm resonators. The same can be applied to the longitudinally coupled resonator-type elastic wave filter 16. Note that the pass band f1 of the first filter preferably is reliably provided by the longitudinally coupled resonator-type elastic wave filter 16, a serial arm resonator and/or a parallel arm resonator, and the like. Upon reliably providing the pass band f1, the insertion loss in the pass band of the second filter is able to be sufficiently reduced by selecting an element to be disposed on the common connection point side like in the first and second preferred embodiments as discussed above.

Further, although the adjustment of the resonant frequencies of the serial arm resonator, parallel arm resonator, and the like is able to be done by selecting appropriate materials and by adequately setting the design parameters, it is preferable to adjust an electrode finger pitch of the IDT electrode. For example, in the first preferred embodiment, it is sufficient to use, of the serial arm resonators, a serial arm resonator in which the electrode finger pitch of the IDT electrode is not the smallest as the serial arm resonator S1 in which the resonant frequency is not the highest. In the case where the serial arm resonator S1 is made to be a serial arm resonator in which the resonant frequency is the lowest, it is preferable to use a serial arm resonator in which the electrode finger pitch of the IDT electrode is the largest as the serial arm resonator S1.

Moreover, in the second preferred embodiment, it is preferable to use, of the parallel arm resonators, a parallel arm resonator in which the electrode finger pitch of the IDT electrode is not the largest as the parallel arm resonator to be connected on the common connection point side, that is, the parallel arm resonator P1 in which the resonant frequency is not the lowest. In the case where the parallel arm resonator P1 is a parallel arm resonator in which the resonant frequency is the highest, it is preferable to use a parallel arm resonator in which the electrode finger pitch of the IDT electrode is the smallest as the parallel arm resonator P1.

Also in the second preferred embodiment, a phase adjustment circuit may be provided like in the case of the first preferred embodiment.

In the case where the resonant frequency is adjusted by the electrode finger pitch of the IDT electrode as described above, the resonant frequency is able to be adjusted with ease in comparison with a case in which the resonant frequency is adjusted by film thickness of the electrode film.

In the present invention, the circuit configuration of the first filter is not limited to any specific one as long as a serial arm resonator, a parallel arm resonator, or a longitudinally coupled resonator-type elastic wave filter is provided on the common connection point side.

Figure 12:
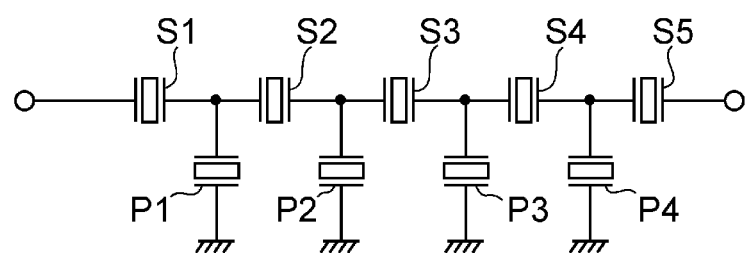
FIG. 12 is a circuit diagram for explaining a ladder circuit as a first filter.

Accordingly, as shown in FIG. 12, the first filter may be a ladder filter including a plurality of serial arm resonators S1 to S5 including elastic wave resonators and a plurality of parallel arm resonators P1 to P4 including elastic wave resonators.

Note that the first filter is not limited to a filter making use of Rayleigh waves propagating in LiNbO$_3$, and may be a filter using another piezoelectric material. Further, the first filter may be a filter using a fundamental wave of other waves than Rayleigh waves, and is not limited to any specific one as long as a fundamental wave and a high-order mode are generated.

As described in working examples 1 to 7, the first filter may be a filter including the longitudinally coupled resonator-type elastic wave filter 16. In this case, the first filter may include only the longitudinally coupled resonator-type elastic wave filter 16. Further, as described in working examples 1 to 7, the configuration of the first filter may be such that at least one of the serial arm resonator and the parallel arm resonator is provided on the common connection point side of the longitudinally coupled resonator-type elastic wave filter 16 or on the opposite side thereof to the common connection point.

Figure 13:
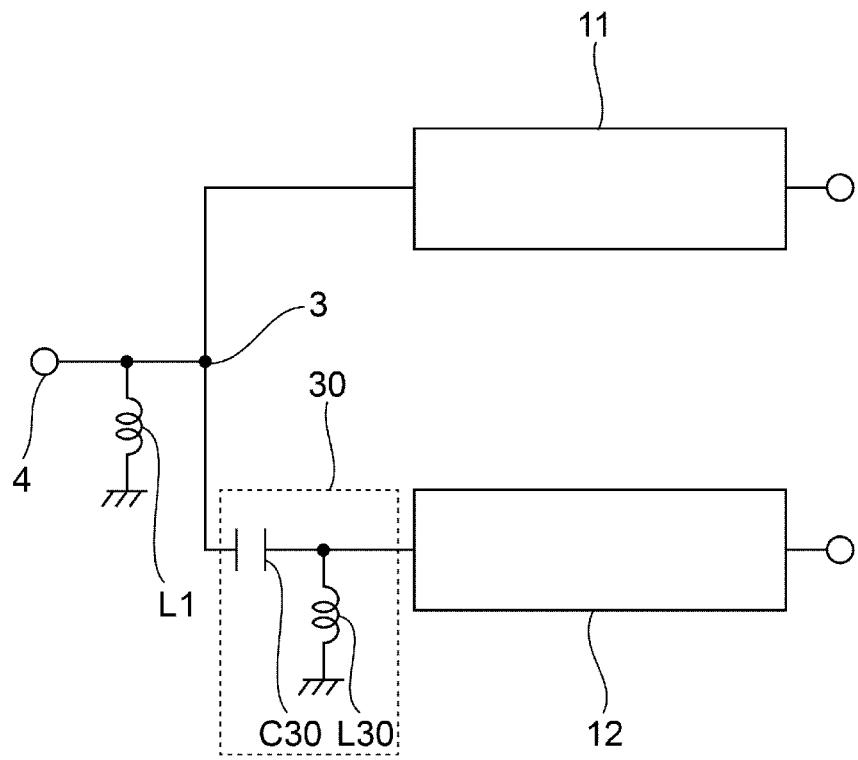
FIG. 13 is a block diagram of an elastic wave filter device according to a third preferred embodiment of the present invention.

FIG. 13 is a block diagram of an elastic wave filter device according to a third preferred embodiment of the present invention.

The third preferred embodiment differs from the first preferred embodiment in a point that a phase adjustment circuit 30 is disposed in a different manner. To be specific, the phase adjustment circuit 30 is disposed between a common connection point 3 and a second filter 12. Other elements are the same as those of the elastic wave filter device 1 in the first preferred embodiment.

The phase adjustment circuit 30 includes a capacitor C30 and an inductor L30. The capacitor C30 is connected between a common connection point 3 and a second filter 12. The inductor L30 is connected between a ground potential and a connection point between the capacitor C30 and the second filter 12. With the phase adjustment circuit 30, a signal phase of a first filter 11 and a signal phase of the second filter 12 are matched on an antenna terminal 4 side. Note that the circuit configuration of the phase adjustment circuit 30 is not limited to the above-described one.

Also in this preferred embodiment, the first filter 11, which is the same as that of the first preferred embodiment, and the second filter 12 are common-connected. This makes it possible to reduce the insertion loss in the pass band of the second filter 12.

Figure 14:
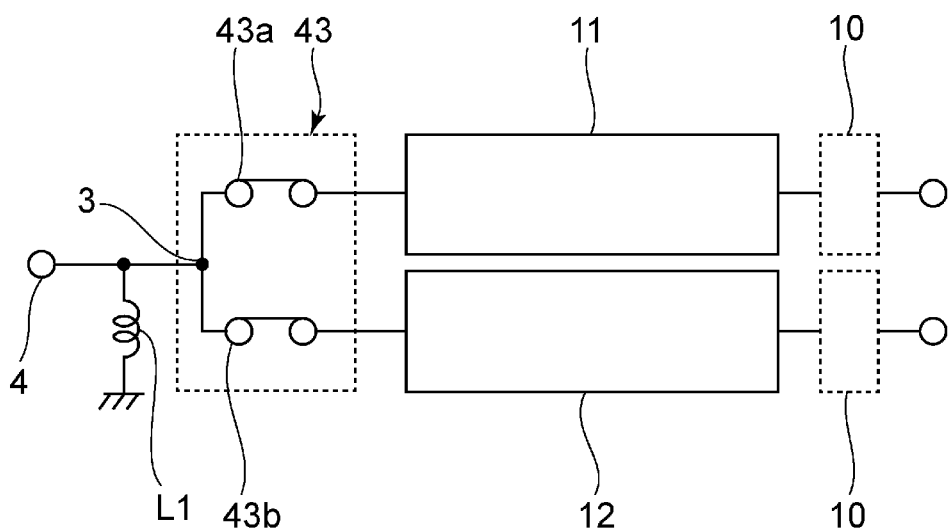
FIG. 14 is a block diagram of an elastic wave filter device according to a fourth preferred embodiment of the present invention.
Figure 15:
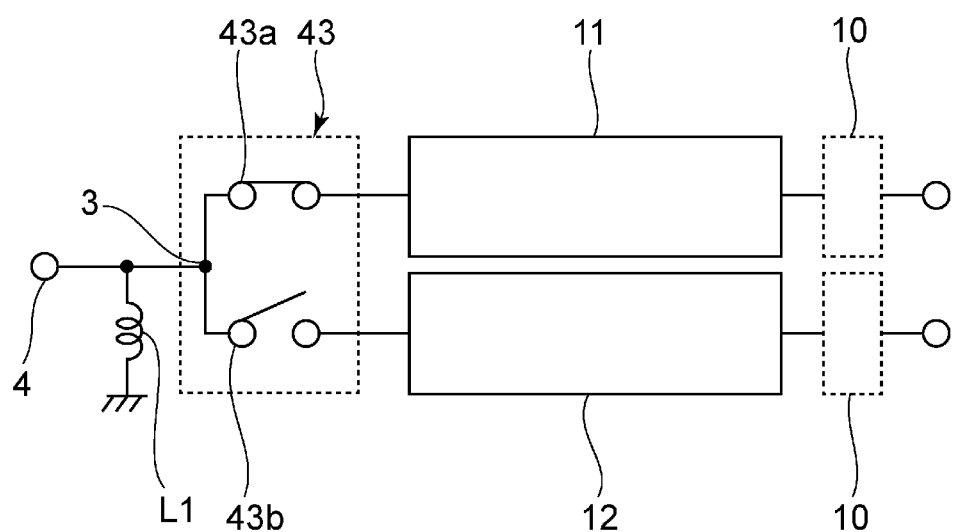
FIG. 15 is another block diagram of the elastic wave filter device according to the fourth preferred embodiment of the present invention.

FIG. 14 is a block diagram of an elastic wave filter device according to a fourth preferred embodiment of the present invention. FIG. 15 is another block diagram of the elastic wave filter device according to the fourth preferred embodiment. A state of a second switching section, which will be explained later, of FIG. 14 is different from that of FIG. 15.

As shown in FIGS. 14 and 15, the fourth preferred embodiment differs from the first preferred embodiment in a point that a first filter 11 and a second filter 12 are common-connected to an antenna terminal 4 via a switch 43. Other elements are the same as those of the elastic wave filter device 1 of the first preferred embodiment.

The switch 43 includes a first switching section 43a and a second switching section 43b. The first switching section 43a is disposed between the first filter 11 and a common connection point 3. The first switching section 43a is a switching section to switch a connecting state between the first filter 11 and the common connection point 3. The second switching section 43b is disposed between the second filter 12 and the common connection point 3. The second switching section 43b is a switching section to switch a connecting state between the second filter 12 and the common connection point 3, as shown in FIGS. 14 and 15.

In the present preferred embodiment, as discussed above, the first filter 11 is connected to the common connection point 3 via the first switching section 43a, and the second filter 12 is connected to the common connection point 3 via the second switching section 43b. It is sufficient that at least one of the first filter 11 and the second filter 12 is connected to the common connection point 3 via the switching section. It is sufficient for the switch 43 to include at least one of the first switching section 43a and the second switching section 43b.

Also in this preferred embodiment, the first filter 11, which is the same as that of the first preferred embodiment, and the second filter 12 are common-connected. This makes it possible to reduce the insertion loss in the pass band of the second filter 12.

In the configurations of the third and fourth preferred embodiments, like in the first preferred embodiment, the resonant frequency f1h of the high-order mode in the first filter 11 is smaller than f2. The resonant frequency f1h of the high-order mode in the first filter 11 may be larger than f2 like in the second preferred embodiment. Also in this case, by providing the first filter 11 with the same structure as that of the second preferred embodiment, the insertion loss in the pass band of the second filter 12 is able to be reduced.

While preferred embodiments of the invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
a first filter including a first pass band f1; and
a second filter including a second pass band f2 that is on a higher frequency side relative to the first pass band f1;
wherein
one end of the first filter and one end of the second filter are common-connected at a common connection point;
the first filter includes, on a common connection point side, a serial arm resonator including an IDT electrode, a parallel arm resonator, or a longitudinally coupled resonator elastic wave filter;
the first filter is a filter that generates a fundamental wave and a high-order mode;
a resonant frequency of the high-order mode that appears on a higher frequency side relative to the first pass band f1 of the first filter is f1h and f1h is smaller than f2; and
on the common connection point side, a serial arm resonator in which the resonant frequency is not highest, a parallel arm resonator, or a longitudinally coupled resonator elastic wave filter, is provided.

2. The elastic wave filter device according to claim 1, wherein the serial arm resonator in which the resonant frequency is not the highest is a serial arm resonator in which the resonant frequency is lowest.

3. The elastic wave filter device according to claim 1, wherein, the serial arm resonator in which the resonant frequency is not the highest is a serial arm resonator in which an electrode finger pitch of the IDT electrode is not smallest and is disposed on the common connection point side in the first filter.

4. The elastic wave filter device according to claim 3, wherein the serial arm resonator in which the electrode finger pitch of the IDT electrode is not the smallest is a serial arm resonator in which the electrode finger pitch of the IDT electrode is largest.

5. The elastic wave filter device according to claim 1, wherein the first filter is an elastic wave filter propagating Rayleigh waves in $LiNbO_3$.

6. The elastic wave filter device according to claim 1, further comprising a phase adjustment circuit.

7. The elastic wave filter device according to claim 1, wherein the first filter is a ladder filter including a plurality of serial arm resonators defined by elastic wave resonators and a plurality of parallel arm resonators defined by elastic wave resonators.

8. The elastic wave filter device according to claim 1, wherein the first filter includes a longitudinally coupled resonator elastic wave filter.

9. The elastic wave filter device according to claim 8, wherein the first filter includes at least one of a serial arm resonator and a parallel arm resonator on the common connection point side of the longitudinally coupled resonator elastic wave filter or on a side of the longitudinally coupled resonator elastic wave filter opposite to the common connection point.

10. The elastic wave filter device according to claim 1, wherein at least one of the first filter and the second filter is connected to the common connection point via a switch that switches a connecting state with the common connection point.

11. The elastic wave filter device according to claim 10, wherein each of the first filter and the second filter is connected to the common connection point via the switch.

12. An elastic wave filter device comprising:
a first filter including a first pass band f1; and
a second filter including a second pass band f2 that is on a higher frequency side relative to the first pass band f1; wherein
one end of the first filter and one end of the second filter are common-connected at a common connection point;
the first filter includes, on a common connection point side, a serial arm resonator, a parallel arm resonator including an IDT electrode, or a longitudinally coupled resonator elastic wave filter;
the first filter is a filter that generates a fundamental wave and a high-order mode;
a resonant frequency of the high-order mode that appears on a higher frequency side relative to the first pass band f1 of the first filter is f1$h$ and f1$h$ is larger than f2; and
on the common connection point side, a parallel arm resonator in which the resonant frequency is not lowest, a serial arm resonator, or a longitudinally coupled resonator elastic wave filter, is provided.

13. The elastic wave filter device according to claim 12, wherein the parallel arm resonator in which the resonant frequency is not the lowest is a parallel arm resonator in which the resonant frequency is highest.

14. The elastic wave filter device according to claim 12, wherein the parallel arm resonator in which the resonant frequency is not the lowest is a parallel arm resonator in which an electrode finger pitch of the IDT electrode is not largest and is disposed on the common connection point side in the first filter.

15. The elastic wave filter device according to claim 14, wherein the parallel arm resonator in which the electrode finger pitch of the IDT electrode is not the largest is a parallel arm resonator in which the electrode finger pitch of the IDT electrode is smallest.

16. The elastic wave filter device according to claim 12, wherein the first filter is an elastic wave filter propagating Rayleigh waves $LiNbO_3$.

17. The elastic wave filter device according to claim 12, further comprising a phase adjustment circuit.

18. The elastic wave filter device according to claim 12, wherein the first filter is a ladder filter including a plurality of serial arm resonators defined by elastic wave resonators and a plurality of parallel arm resonators defined by elastic wave resonators.

19. The elastic wave filter device according to claim 12, wherein the first filter includes a longitudinally coupled resonator elastic wave filter.

20. The elastic wave filter device according to claim 19, wherein the first filter includes at least one of a serial arm resonator and a parallel arm resonator on the common connection point side of the longitudinally coupled resonator elastic wave filter or on a side of the longitudinally coupled resonator elastic wave filter opposite to the common connection point.

21. The elastic wave filter device according to claim 12, wherein at least one of the first filter and the second filter is connected to the common connection point via a switch that switches a connecting state with the common connection point.

22. The elastic wave filter device according to claim 21, wherein each of the first filter and the second filter is connected to the common connection point via the switch.

* * * * *